(12) United States Patent
Grundy et al.

(10) Patent No.: US 9,938,148 B2
(45) Date of Patent: Apr. 10, 2018

(54) METHOD OF SYNTHESISING NITRIDE NANOCRYSTALS

(71) Applicant: Sharp Kabushiki Kaisha, Osaka (JP)

(72) Inventors: Alastair James Daniel Grundy, Oxford (GB); Peter Neil Taylor, Oxford (GB); Michael Alan Schreuder, Anderson, SC (US); Stewart Edward Hooper, Witney (GB); Jonathan Heffernan, Sheffield (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/440,048

(22) PCT Filed: Nov. 12, 2013

(86) PCT No.: PCT/JP2013/006659
§ 371 (c)(1),
(2) Date: Apr. 30, 2015

(87) PCT Pub. No.: WO2014/076944
PCT Pub. Date: May 22, 2014

(65) Prior Publication Data
US 2015/0291423 A1 Oct. 15, 2015

(30) Foreign Application Priority Data
Nov. 13, 2012 (GB) .................................. 1220400.4

(51) Int. Cl.
*C01B 21/072* (2006.01)
*C09K 11/02* (2006.01)
(Continued)

(52) U.S. Cl.
CPC ............ *C01B 21/072* (2013.01); *B82Y 30/00* (2013.01); *C01B 21/06* (2013.01);
(Continued)

(58) Field of Classification Search
None
See application file for complete search history.

(56) References Cited

U.S. PATENT DOCUMENTS 4,869,925 A 9/1989 Hiai et al.
8,945,964 B2* 2/2015 Taylor ................... B82Y 30/00
438/46
(Continued)

FOREIGN PATENT DOCUMENTS

GB 2429838 A 3/2007
GB 2467161 A 7/2010
(Continued)

OTHER PUBLICATIONS

Hiroyuki et al. JP 2004-307679 machine translation Sep. 2015.*
(Continued)

*Primary Examiner* — Guinever S Gregorio
(74) *Attorney, Agent, or Firm* — Renner, Otto, Boisselle & Sklar, LLP (57) ABSTRACT

A method of producing nitride nanoparticles comprises reacting at least one organometallic compound, for example an alkyl metal, with at least one source of nitrogen. The reaction may involve one or more liquid phase organometallic compounds, or may involve one or more liquid phase organometallic compounds dissolved in a solvent or solvent mixture. The reaction constituents may be heated to a desired reaction temperature (for example in the range 40° C. to 300° C.).

20 Claims, 9 Drawing Sheets (51) Int. Cl.
C09K 11/54 (2006.01)
C09K 11/62 (2006.01)
C09K 11/64 (2006.01)
C01B 21/06 (2006.01)
B82Y 30/00 (2011.01)
C30B 7/14 (2006.01)
C30B 29/38 (2006.01)
C30B 29/60 (2006.01)

(52) U.S. Cl.
CPC ...... *C01B 21/0632* (2013.01); *C01B 21/0637* (2013.01); *C09K 11/02* (2013.01); *C09K 11/54* (2013.01); *C09K 11/62* (2013.01); *C09K 11/64* (2013.01); *C30B 7/14* (2013.01); *C30B 29/38* (2013.01); *C30B 29/60* (2013.01); *C01P 2002/72* (2013.01); *C01P 2002/84* (2013.01); *C01P 2004/64* (2013.01)

(56) References Cited

U.S. PATENT DOCUMENTS

| | | | |
|---|---|---|---|
| 2006/0087048 | A1 | 4/2006 | Mello et al. |
| 2007/0297969 | A1* | 12/2007 | Van Patten ............ B82Y 30/00 423/409 |
| 2008/0160306 | A1 | 7/2008 | Mushtaq et al. |
| 2012/0025146 | A1 | 2/2012 | Taylor et al. |

FOREIGN PATENT DOCUMENTS

| | | | | |
|---|---|---|---|---|
| GB | | 2467162 A | 7/2010 | |
| GB | | 2472541 A | 2/2011 | |
| GB | | 2482311 A | 2/2012 | |
| JP | | 53-68700 | 6/1978 | |
| JP | | 62-108720 | 5/1987 | |
| JP | | 63-112406 | 5/1988 | |
| JP | | 01-252510 | 10/1989 | |
| JP | | 2004-307679 A | 11/2004 | |
| JP | | 2007-077245 A | 3/2007 | |
| JP | | 2012-031057 A | 2/2012 | |
| WO | WO 03/054953 | A1 | 7/2003 | |
| WO | WO 2008/094292 | A1 | 8/2008 | |
| WO | WO 2010085001 | A1 * | 7/2010 | ............ B82Y 30/00 |
| WO | WO 2010/118279 | A1 | 10/2010 | |

OTHER PUBLICATIONS

Tatsuya et al. JP 2007-077245 machine translation 2015.*
Neil et al. JP 2012-031057 machine translation 2015.*
Wei et al.; Studies of Organometallic Precursors to Aluminum Nitride; Accession No. ADA 1169482; May 9, 1986.*
International Search Report for corresponding International Application No. PCT/JP2013/006659 dated Feb. 18, 2014.
Form PCT/ISA/237 for corresponding International Application No. PCT/JP2013/006659 dated Feb. 18, 2014.
Strouse et al., "Microwave-Enhanced Reaction Rates for Nanoparticle Synthesis", J. Am. Chem. Soc., 2005, 127, 15791.
Van Patten et al., "New Pyrolysis Route to GaN Quantum Dots", Chem. Mater., 2006, vol. 18, No. 17, pp. 3915-3917.
Gillian et al., "Low-temperature solvothermal synthesis of nanocrystalline indium nitride and Ga—In—N composites from the decomposition of metal azides", J. Mater. Chem., 2006, 38, 3774.
Nann et al., "Rapid Synthesis of Highly Luminescent InP and InP/ZnS Nanocrystals", J. Mater. Chem., 2008, 18, pp. 2653-2656.
Battaglia and Peng, "Formation of High Quality InP and InAs Nanocrystals in a Noncoordinating Solvent", Nano Letters, 2002, vol. 2, No. 9, pp. 1027-1030.
Peng et al., "Control of Photoluminescence Properties of CdSe Nanocrystals in Growth", J. Am. Chem. Soc., 2002, vol. 124, No. 9, pp. 2049-2055.
Bawendi et al., "Synthesis and Characterizations of Nearly Monodisperse CdE (E=S, Se, Te) Semiconductor Nanocrystallites", J. Am. Chem. Soc., 1993, 115, pp. 8706-8715.
Li and Reiss, "One-pot Synthesis of Highly Luminescent InP/ZnS Nanocrystals without Precursor Injection", J. Am. Chem. Soc., 2008, 130, pp. 11588-11589.
Bawendi et al., "(CdSe)ZnS Core-Shell Quantum Dots: Synthesis and Characterization of a Size Series of Highly Luminescent Nanocrystallites", J. Phys. Chem. B, 1997, 101, pp. 9463-9475.
Alivisatos et al., "Synthesis of Soluble and Processable Rod-, Arrow-, Teardrop-, and Tetrapod-Shaped CdSe Nanocrystals", J. Am. Chem. Soc., 2000, 122, pp. 12700-12706.
Office Action for corresponding Japanese Application No. 2015-538644 dated Feb. 23, 2016.
Office Action for related Japanese Application No. 2015-538644 dated Aug. 9, 2016.

* cited by examiner

METHOD OF SYNTHESISING NITRIDE NANOCRYSTALS

TECHNICAL FIELD

This invention relates to the synthesis of nitride nanocrystals. In particular it relates to a synthesis method using one or more organometallic compound(s) that either are in the liquid phase or are in solution.

BACKGROUND ART

Semiconductor nanocrystals whose dimensions are comparable to the bulk exciton diameter show quantum confinement effects. This is seen most clearly in the optical emission spectra which shift towards the red and/or infrared as the size of the crystal is increased.

Semiconductor nanocrystals made from a wide range of materials have been studied including many II-VI and III-V semiconductors. In addition to spherical nanocrystals rod-, arrow-, teardrop- and tetrapod-shaped nanocrystals [Alivisatos et. al., J. Am. Chem. Soc, 2000, 122, 12700; WO03054953] and core/shell structures [Bawendi, J. Phys. Chem. B, 1997, 1010, 9463; Li and Reiss, J. Am. Chem. Soc., 2008, 130, 11588] have also been prepared. To control the size and shape of such nanocrystals their synthesis is generally performed in the presence of one or more capping agents (sometimes called surfactants or coordinating solvents). Such capping agents control the growth of the nanocrystals and also increase the intensity of the light emission though the passivation of surface states. A wide range of capping agents have been employed including phosphines [Bawendi et. al., J. Am. Chem. Soc., 1993, 115, 8706], phosphine oxides [Peng et. al., J. Am. Chem. Soc., 2002, 124, 2049], amines [Peng et. al., J. Am. Chem. Soc., 2002, 124, 2049], fatty acids [Battaglia and Peng, Nano Lett., 2002, 2, 1027; Peng et. al., J. Am. Chem. Soc., 2002, 124, 2049], thiols [Li and Reiss, J. Am. Chem. Soc., 2008, 130, 11588] and more exotic capping agents such a metal fatty acid complexes [Nann et. al., J. Mater. Chem., 2008, 18, 2653].

Methods to prepare semiconductor nanocrystals include solvothermal reactions [Gillan et. al., J. Mater. Chem., 2006, 38, 3774], hot injection methods [Battaglia and Peng, Nano Lett., 2002, 2, 1027], simple heating processes [Van Patten et. al., Chem. Mater., 2006, 18, 3915], continuous flow reactions [US2006087048] and microwave assisted synthesis [Strouse et. al., J. Am. Chem. Soc., 2005, 127, 15791].

Nitride nanocrystals have been produced before by Sharp [UK Patent applications GB2467161, GB2482311, and GB2467162]. However, the synthesis method included a long ligand and required temperatures in excess of 150° C.

WO 2008/094292 proposes the growth of a nitride nanocrystal shell, for a nanocrystal having a core of a group II alloyed I-III-VI material, by the pyrolysis (that is, thermal decomposition) of organometallic precursors in a chelating ligand solution.

JP 2004/307679 proposes the gaseous phase growth of indium nitride nanoparticles using triethylindium and nitrogen as precursors.

US 2008/160306 proposes a nanostructure growth method in which a molecular cluster compound is used to seed the growth of nanoparticles from a reaction mixture.

WO 2010/118279 proposes the growth of a metal sulphide shell around a nanocrystal core using zinc acetate as the metal precursor in formation of a zinc sulphide shell.

GB 2429838 and GB 2472541 propose methods for the synthesis of nanocrystals of ZnS, ZnSe, CdS etc. The use of organometallic precursors is mentioned, although both documents investigate other materials in view of the handling difficulties described as associated with organometallic compounds.

CITATION LIST

Patent Literature

PTL 1: WO03054953
PTL 2: US2006087048
PTL 3: GB2467161
PTL 4: GB2482311
PTL 5: GB2467162
PTL 6: WO 2008/094292
PTL 7: JP 2004/307679
PTL 8: US 2008/160306
PTL 9: WO 2010/118279
PTL 10: GB 2429838
PTL 11: GB 2472541

Non Patent Literature

NPL 1: Alivisatos et. al., J. Am. Chem. Soc, 2000, 122, 12700
NPL 2: Bawendi, J. Phys. Chem. B, 1997, 1010, 9463
NPL 3: Li and Reiss, J. Am. Chem. Soc., 2008, 130, 11588
NPL 4: Bawendi et. al., J. Am. Chem. Soc., 1993, 115, 8706
NPL 5: Peng et. al., J. Am. Chem. Soc., 2002, 124, 2049
NPL 6: Battaglia and Peng, Nano Lett., 2002, 2, 1027
NPL 7: Nann et. al., J. Mater. Chem., 2008, 18, 2653
NPL 8: Gillan et. al., J. Mater. Chem., 2006, 38, 3774
NPL 9: Van Patten et. al., Chem. Mater., 2006, 18, 3915
NPL 10: Strouse et. al., J. Am. Chem. Soc., 2005, 127, 15791

SUMMARY OF INVENTION

Technical Problem

It would be advantageous if the nitride nanoparticles could be produced without using capping agents, ligand materials, seed particles and catalysts.

It would be advantageous if the nitride nanoparticles could be produced at low temperature.

Solution to Problem

According to the one aspect of the present invention, a method of producing nitride nanoparticles, the method comprising: reacting at least one source of nitrogen with at least one organometallic compound, the organometallic compound(s) being either in a liquid phase or in solution.

According to the another aspect of the present invention, a nitride nanoparticle obtainable by the method of the present invention.

Advantageous Effects of Invention

This invention offers the following advantages over the prior art:

Cost—by removing the requirement for capping agents, ligand materials, seed particles and catalysts the overall cost of the reaction is significantly lower than others described in the prior art.

Purity—by removing the requirement for capping agents, ligand materials, seed particles and catalysts the number of elements involved in the reaction can be reduced to include just those required in the nanocrystal product plus hydrogen and carbon.

Temperature—the reactivity of organometallic compounds such as alkyl metals means that their use as a metal precursor in a method of the invention allows reaction temperatures in the invention to be as low as 40° C., significantly lower than other reactions detailed in the prior art.

Flexibility—Typically, when a nanocrystal is synthesised it acquires a long ligand as a result of the reactions taking place. It is often desirable to have a particular ligand on a nanocrystal for functional reasons. The process of ligand exchange (swapping an unwanted ligand for a desirable one) can be complex. In this invention the nanocrystals may be synthesised with no ligands (or alternatively with just hydrogen atoms and/or ethyl groups as ligands), making it very simple to add the ligand of choice at a later time.

DESCRIPTION OF EMBODIMENTS

A first aspect of the invention provides a method of producing nitride nanoparticles, the method comprising: reacting at least one source of nitrogen with at least one organometallic compound, the organometallic compound(s) being either in a liquid phase or in solution.

The method may comprise reacting the at least one organometallic compound and the at least one source of nitrogen in at least one solvent.

The method may comprise reacting the at least one organometallic compound and the at least one source of nitrogen in a solvent mixture comprising at least two solvents.

At least one of the solvents in the solvent mixture may provide a ligand for the nitride nanoparticles. (For the avoidance of doubt, in an embodiment in which only a single solvent is used, the solvent may provide a ligand for the nitride nanoparticles.) This is a convenient way of providing a ligand material in the resultant nitride nanocrystals. (In some cases it may be desired to incorporate one or more ligand species in the resultant nitride nanocrystals—for example, ligands may improve the solubility of the resulting nanocrystals in non-polar solvents such as toluene and hexanes, and/or may be provided to improve the photoluminescence quantum yield (PLQY) of the nanocrystals.) If it is desired to incorporate more than one ligand type into the nanoparticles, it would be possible to use a solvent mixture that includes two (or more) solvents that each provide a ligand for the nitride nanoparticles.

The at least one solvent may comprise an aprotic solvent.

The at least one source of nitrogen may comprise, or even consist solely of, ammonia.

Alternatively, the at least one source of nitrogen may comprise, or even consist solely of, a metal amide. It has been found that use of a metal amide as a nitrogen source in the growth of nitride nanoparticles using one or more organometallic compounds as the metal precursor for the nitride nanoparticles allows the nanoparticle growth to occur at temperatures as low as 40° C. This is surprising since metal amides and organometallic compounds are both strong bases and as such would not be expected to react with each other. Further, one of the side products in this reaction is a highly reactive organometallic (in the case of synthesis of $Zn_3N_2$ from diethylzinc ($Et_2Zn$) and sodium amide, for example, a side product would be NaEt)—and the high reactivity of such side products is a further reason why it is surprising that the reaction occurs.

The method may comprise disposing the at least organometallic compound and the at least one source of nitrogen in the at least one solvent to form a reaction mixture.

The method may comprise, at a first time, disposing a first quantity of the or each organometallic compound in the at least one solvent and, at a second time later than the first time, disposing a second quantity of the or each organometallic compound in the at least one solvent. After the first quantity of the or each organometallic compound is added, the reaction is allowed to reach completion (which typically occurs after some minutes, depending on the amounts of reaction constituents present). At this time the reaction can be halted if the desired size of nanoparticle has been obtained or, if larger nanocrystals are required, a second quantity of the or each organometallic compound may be added so as to restart the nanoparticle growth. This process of addition of a quantity of the or each organometallic compound to restart the reaction can be repeated as many times as necessary until the desired size of nanoparticles are obtained. This provides control over the size of the obtained nanoparticles, and also may provide purer nanoparticles by eliminating or reducing the amount of excess organometallic compound(s) present in the reaction mixture and available for incorporation as an impurity in the resultant nanoparticles.

Alternatively, the method may comprise disposing the at least one organometallic compound in the at least one solvent to form a reaction mixture, and passing the at least one source of nitrogen through the reaction mixture.

The method may comprise heating the reaction mixture to a temperature greater than 40° C.

The method may comprise heating the reaction mixture to a temperature less than 300° C. This allows the reaction to be performed using relatively simple apparatus, since high temperatures and high pressures are not required in a method of the invention.

Where a metal amide is used as the nitrogen source, the method may comprise heating the reaction mixture to a temperature less than 200° C. It has been found that reaction temperatures below 200° C. (but above 40° C.), provide good reaction speed and good quality of the resultant nanoparticles. In particular, a reaction temperature of around 100-120° C., for example 110° C., has been found to produce particularly good results. While higher reaction temperatures than 200° C. could be used, the reaction speed may become very high at reaction temperatures significantly over 200° C. and this may lead to reduced control over the size of the resultant nanoparticles and hence reduced control over their properties.

Where ammonia is used as the nitrogen source, the method may comprise heating the reaction mixture to a temperature greater than 200° C., for example in the range of 200° C.-300° C. It has been found that, when ammonia is used as the nitrogen source, reaction temperatures greater than 200° C. provide good reaction speed and good quality of the resultant nanoparticles. The reaction of organometallic precursors with ammonia (eg in the gas phase) is known for reaction temperatures in excess of 600° C. where the mechanism involves cracking the ammonia. In this application it is however shown that nitride nanoparticle growth using ammonia as the nitrogen source can occur at much lower reaction temperatures, for example reaction temperatures down to 200° C. or even lower—and carrying out the growth process at these temperatures is much simpler than carrying out the growth at of 600° C. Cracking of the ammonia is not possible at these low reaction temperatures, and it appears that the organometallic compound acts as a base in the reaction, removing the protons from the ammonia and forming simple alkanes.

The at least one solvent may comprise an amine. This leads to the incorporation of amine ligands in the resultant nanoparticles, and it has been shown that amine ligands are particularly good at improving the solubility of the nitride nanocrystals in non-polar solvents and improving the quantum efficiency of the nanocrystals.

If the at least one source of nitrogen consists solely of ammonia gas the volume of ammonia (as measured at room temperature and pressure, that is 25° C. and 100 kPa, also known as Standard ambient temperature and pressure (SATP)—all values for ammonia volumes in this application are at SATP) per minute passed through the reaction mixture may be greater than 1% of the volume of the reaction mixture. It may be preferable for the volume of ammonia per minute passed through the reaction mixture to be a small percentage of the volume of the reaction mixture, for example around 10-20%, or around 15%, of the volume of the reaction mixture, as it has been found that this produces nanoparticlces with a high PLQY. However, It is unlikely that a very low rate of flow of ammonia would provide sufficient ammonia to obtain nanoparticles with high PLQY values, and it is therefore preferable if the volume of ammonia per minute passed through the reaction mixture is greater than around 1% of the volume of the reaction mixture, and it may be beneficial if the volume of ammonia per minute passed through the reaction mixture is greater than around 5% of the volume of the reaction mixture. Additionally, the volume of ammonia per minute passed through the reaction mixture is preferably less than the volume of the reaction mixture, since a higher flow rate of ammonia than this would be likely to cause a very slow reaction.

The at least one organometallic compound may comprises at least one alkyl metal compound. Where two or more organometallic compounds are used, each organometallic compound may be an alkyl metal.

The at least one alkyl metal compound may comprise one or more of: diethylzinc, triethylaluminium and trimethylindium.

When the at least one source of nitrogen consists solely of ammonia gas, the molar quantity of the first and any subsequent addition of the or each organometallic compound may be at least 2% of the molar quantity of ammonia passing through the reaction mixture per minute. Additionally or alternatively, the molar quantity of the first and any subsequent addition of the or each organometallic compound may be no more than twice the molar quantity of ammonia passing through the reaction mixture per minute. Where the molar quantity of the organometallic compound(s) added at each addition is 1 mmol, for example, this would correspond to a flow rate of ammonia through the reaction mixture of 0.6 mL/min to 60 mL/min (measured at SATP), and a flow rate in this range has been found to provide good results. More specifically, where the molar quantity of the organometallic compound(s) added at each addition is 1 mmol, ammonia flow rates greater than 2.5 mL/min and less than 10 mL/min (ie, corresponding to a molar flow rate of ammonia greater than approximately 8.3% of the molar quantity of the organometallic compound (s) and less than approximately 33% of the molar quantity of the organometallic compound(s)) have been found to provide particularly good results.

A second aspect of the invention provides a nitride nanoparticle obtainable by a method of the first aspect.

The nitride nanoparticle may be a nanoparticle containing a nitride of one of more elements of group IA, or it may be a nanoparticle containing a nitride of one of more elements of group IIIA.

The nitride nanoparticle may be a light-emissive nitride nanoparticle.

The nitride nanoparticle may be a zinc nitride nanoparticle.

The nitride nanoparticle may be a light-emissive zinc nitride nanoparticle having maximum photoluminescence emission intensity at a wavelength between 500 and 1100 nm.

Figure 1:
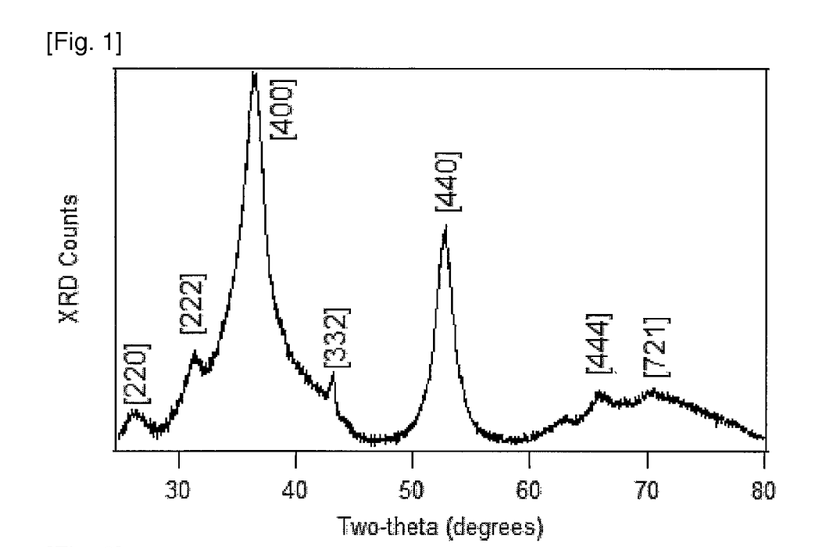
FIG. 1 An X-ray diffraction (XRD) pattern for zinc nitride nanocrystals grown using diethylzinc and ammonia as zinc and nitrogen precursors respectively.

This invention discloses a method for preparing nitride nanocrystals from one or more organometallic compound(s) and a nitrogen precursor. Nanocrystals of high quality have been synthesised using this technique (FIG. 1).

As is known, an organometallic compound is a compound that contains at least bond between a metal atom and a carbon atom. One example of an organometallic compound is an alkyl metal compound or just alkyl metal (otherwise known as a metal-alkyl), which is a compound that includes an alkyl group and a metal atom or atoms. An alkyl group is a group that contains single-bonded carbon and hydrogen atoms, and some common examples of alkyl groups include methyl groups and ethyl groups.

Embodiments of the invention are described below with particular reference to alkyl metals, but the invention is not limited to alkyl metals and other organometallic compounds may be used in a method of the present invention. For example metal phenyls, such as diphenylzinc, are another example of organometallic compounds that may be used.

A method of the invention may use one or more liquid phase organometallic compounds. By liquid-phase organometallic compound is meant an organometallic compound that is in the liquid phase at the reaction temperature. Alternatively, a method of the invention may use one or more organometallic compounds that are in solution, i.e. dissolved in one or more solvents.

For the purpose of this application, nitride nanocrystals are particles which have dimensions below 100 nm in at least one direction, and possibly have dimensions below 100 nm in all three orthogonal directions, and contain nitrogen as an anion. These particles may be comprised of an inorganic core with organic ligands.

In preferred examples, a liquid phase alkyl-metal, a nitrogen precursor, and a solvent are heated together. After some time the nanocrystal reaction is cooled and the nanocrystals in solution are collected. They may then be separated from the remaining precursors and bi-products for use.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

This invention discloses a method for preparing nitride nanocrystals from a liquid-phase alkyl-metal and a nitrogen precursor. Nanocrystals of high quality have been synthesised using this technique (FIG. 1).

Nitride nanocrystals are particles which have dimensions below 100 nm in any direction and contain nitrogen as an anion. These particles may be comprised of an inorganic core, or may be comprised of an inorganic core with organic ligands—one advantage of the present invention is that it may be used to obtain nanocrystals with or without ligands. It is sometimes advantageous for nanocrystals to have ligands, depending on the final application of the materials.

In preferred embodiments, an alkyl-metal, a nitrogen precursor, and a solvent are heated together. After some time the nanocrystal reaction is cooled and the nanocrystals in solution are collected. They may then be separated from the remaining precursors and bi-products for use.

Any suitable liquid-phase alkyl-metal may be used; in particular metals from group IA (Li, Na etc.), IB (Cu, Ag etc.), IIA (Be, Mg etc.), IIB (Zn, Cd etc.) and IIIA (B, Al, Ga, In etc.) may be used. More specifically the nanoparticles obtained by the invention may be composed of materials such as ZnN, InN, AlN, GaN, and LiN.

The invention may be used to fabricate light-emissive nitride nanoparticles. The invention may for example used to fabricate light-emissive nitride nanoparticles having a photoluminescence quantum yield (PLQY) greater than 5%. Alternatively, the QY is greater than 10%. Alternatively, the QY is greater than 15%. Alternatively, the QY is greater than 20%.

The reaction temperature may be between 40° C. and 300° C., and may optionally be between 70° C. and 250° C. It has been found that a reaction temperature in the range 70-250° C. leads to nanoparticles having good purity and good photoluminescence quantum efficiency. However the invention is not limited to a reaction temperature in the range 70-250° C., or even to a reaction temperature in the range 40-300° C.

In one case an organometallic compound (such as an alkyl metal), a nitrogen precursor, and a solvent are heated together. After some time the nanocrystal reaction is cooled and the nanocrystals in solution are collected. They may then be separated from the remaining precursors and bi-products for use.

In an embodiment the solvent may be any suitable aprotic solvent. (As is known, an aprotic solvent is a solvent that does not contain O—H or N—H bonds.) In one case the solvent may be a mixed solvent, combining two or more solvents. In this case one of the components of the mixed solvent might act as a ligand.

In an embodiment the solvent or mixed solvent may contain one or more of toluene, hexanes, 1-octadecene (ODE), pyridine, tetrahydrofuran (THF), 1-hexadecanethiol (HDT), diethylether, cyclohexane, benzene, Trioctylphosphine oxide (TOPO), trioctylphosphine (TOP), an amine such as dioctylamine or oleylamine, 1-hexadecanol.

In an embodiment the nitrogen-containing precursor could be ammonia or a metal amide. More specifically the metal amide could be sodium amide, lithium amide, or zinc amide.

EXAMPLES

Below are described seventeen examples which have been successfully tested and support this patent application.

<Example 1> Diethylzinc (DEZ) and Sodium Amide to Make Zinc Nitride Nanocrystals In a 50 mL flask, diethylzinc (3 mmole), sodium amide (2 mmole), and toluene (10 mL) as a solvent were stirred and heated at 70° C. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Upon reaching the desired colour of 775 nm the solution was cooled rapidly to stop the reaction. The solution is then centrifuged to remove insoluble material. The remaining soluble material is then used as a nanocrystal solution.

<Example 2> Toluene at High Temperature

Figure 2:
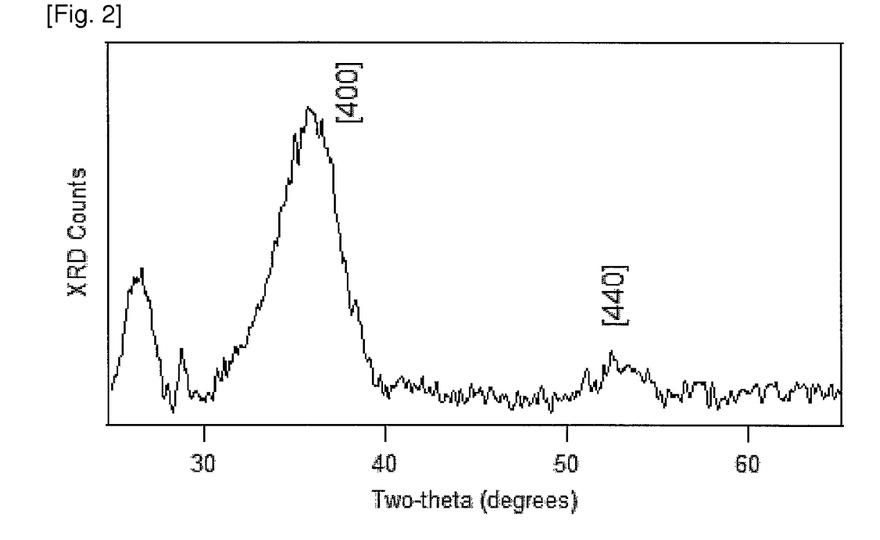
FIG. 2 An XRD pattern for zinc nitride nanocrystals grown using diethylzinc and sodium amide as zinc and nitrogen precursors respectively. Peaks relating to diffraction from specific crystal planes are labelled accordingly.
Figure 3:
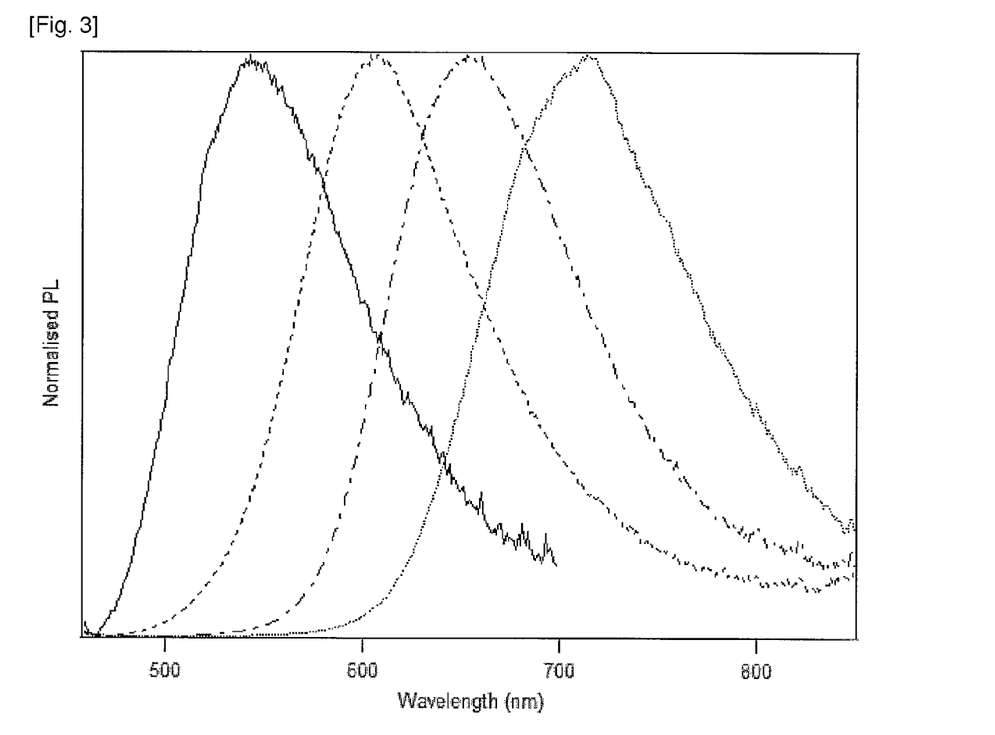
FIG. 3 Emission spectra from various aliquots taken from a single reaction of Example 2 at different times.
Figure 4:
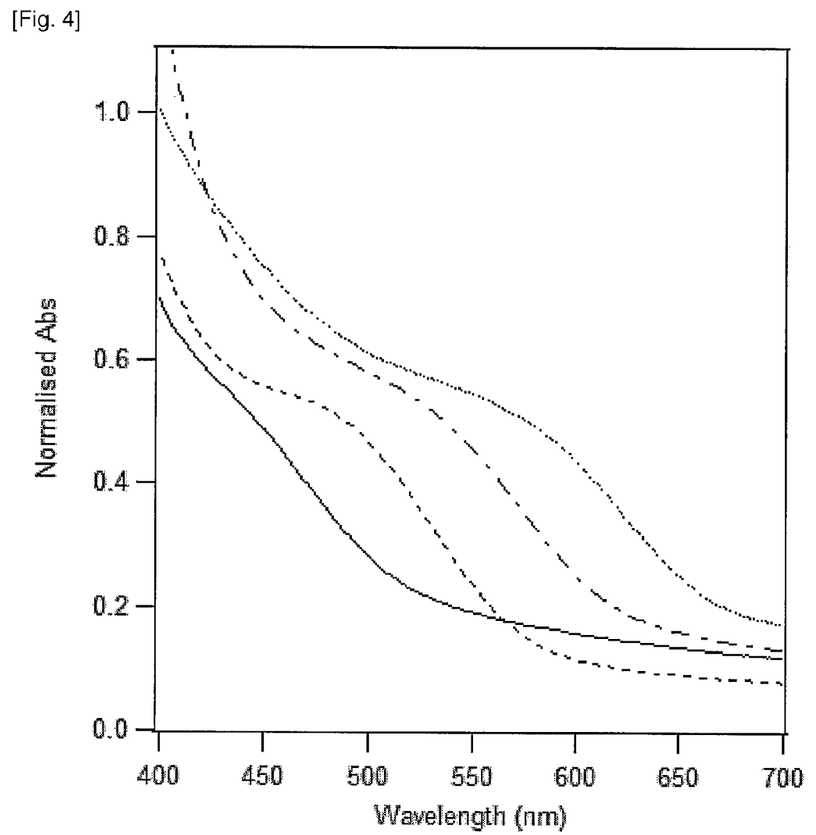
FIG. 4 Absorption spectra from various aliquots taken from a single reaction of Example 2 at different times.

In a 50 mL flask, diethylzinc (3 mmole), sodium amide (2 mmole), and toluene (10 mL) as a solvent were stirred and heated at 110° C. The reaction was then allowed to proceed with small aliquots being taken at various times and diluted with toluene. The resulting solutions were analysed by a Flouromax-4 spectrofluorometer; these solutions showed an increase in the wavelength of peak emission over the course of the reaction (FIG. 3). (The traces in FIG. 3 are arranged with later traces to the right of the figure.) The absorption of each aliquot was also measured and the absorption edge found to move to higher wavelengths as the reaction progressed (FIG. 4—the trace shown as a full line in FIG. 4 corresponds to the trace shown as a full line in FIG. 3, etc). Upon reaching the desired colour the reaction is quenched by rapidly cooling the solution by adding a quantity of solvent. The solution is then centrifuged to remove insoluble material. The remaining soluble material is used as a nanocrystal solution. A Bruker D2 Phaser XRD was used to confirm the presence of zinc nitride nanocrystals (FIG. 2).

The addition of suitable ligands to the purified nanocrystals prepared in this example can increase the photoluminescence quantum yield significantly. Ligands may be added by treatment of the nanocrystal solution with hexane (30 mL) to cause the precipitation of the nanocrystals. The resulting nanocrystals can be redissolved in a solvent of choice which may contain a suitable ligand. When primary or secondary amines (e.g. oleylamine, dioctylamine), alkylthiols (e.g. 1-hexadecanethiol) or alkoxides (e.g. 1-hexadecanol) are used as ligands the photoluminescence quantum yield of the nanocrystal solution is around 40%.

<Example 3> ZnN Nanocrystal Synthesis Using DEZ and $NH_3$

In a 50 mL flask, diethylzinc (3 mmole), and 1-octadecene (10 mL) as a solvent were stirred and heated at 250° C. When up to temperature $NH_3$ gas was bubbled through the solution as a nitrogen source. Upon reaching the desired colour (that is, upon reaching the desired peak emission wavelength as the peak photoluminescence emission wavelength increases over the course of the reaction) the reaction is quenched by rapidly cooling the solution by adding a quantity of solvent. The solution is then centrifuged to remove insoluble material. The remaining soluble material is used as a nanocrystal solution. The formation of ZnN nanocrystals was confirmed by drying out the nanocrystal solution and measuring an X-ray diffraction pattern using a Bruker D2 Phaser XRD (FIG. 1) of the resulting solid.

Figure 5:
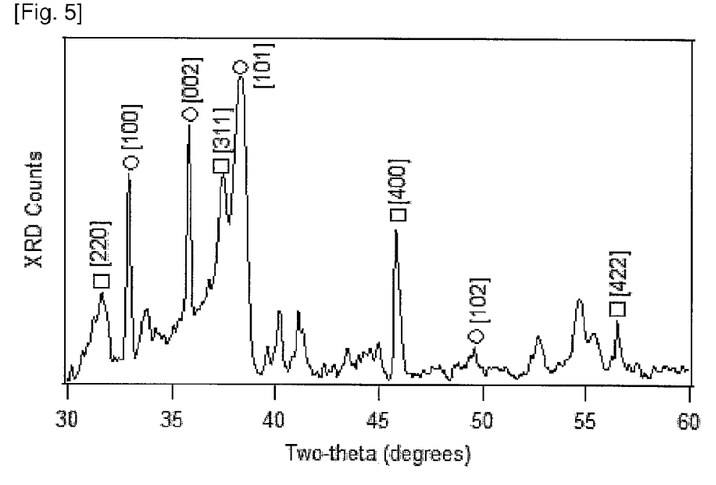
FIG. 5 An XRD pattern for aluminium nitride (AlN) nanocrystals grown using triethylaluminium and ammonia as aluminium and nitrogen precursors respectively. Peaks relating to diffraction from specific crystal planes of cubic (squares) and hexagonal (circles) phases of AlN are labelled accordingly.

<Example 4> Triethylaluminium and $NaNH_2$ to Make Aluminium Nitride Nanocrystals In a 50 mL flask, triethylaluminium (3 mmole), sodium amide (4 mmole), and 1-octadecene (10 mL) as a solvent were stirred and heated at 250° C. for 15 mins. At this time, the heat source was removed. The solution is then centrifuged to remove insoluble material. The remaining soluble material is used as a nanocrystal solution. The formation of AlN nanocrystals was confirmed by drying out the nanocrystal solution and measuring an X-ray diffraction pattern using a Bruker D2 Phaser XRD (FIG. 5) of the resulting solid.

<Example 5> OLA (Oleylamine) as a Ligand Concentration 1

In a 50 mL flask, diethylzinc (3 mmole), sodium amide (3 mmole), oleylamine (500 uL (micro L)), and toluene (10 mL) as a solvent were stirred and heated at 110° C. The oleylamine and toluene formed a solvent mixture, and the oleylamine also acted as a source of ligands in the resultant nanoparticles. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Upon reaching the desired colour (that is, upon reaching the desired peak emission wavelength) the heat source was removed and the reaction stopped. The solution was then centrifuged to remove insoluble material. The remaining soluble material was then used as a nanocrystal solution. The PL QY was measured to be 16.5% at 600 nm peak wavelength.

<Example 6> HDT (Hexadecanethiol) as a Ligand Source

In a 50 mL flask, diethylzinc (3 mmole), sodium amide (3 mmole), hexadecanethiol (1 mmole), and toluene (10 mL) were stirred and heated at 150° C. The hexadecanethiol and toluene formed a solvent mixture, and the hexadecanethiol also acted as a source of ligands in the resultant nanoparticles. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Upon reaching a peak emission wavelength of 677 nm the heat source was removed and the reaction stopped. The solution was then centrifuged to remove insoluble material. The remaining soluble material was then used as a nanocrystal solution.

<Example 7> Microwave 1 OLA 100 uL

In a 10 mL reaction vessel, diethylzinc (1 mmol), sodium amide (1.4 mmol), oleylamine (100 uL), and toluene (5 mL) were stirred and heated in a 300 W CEM Discover-s microwave to 125° C. The oleylamine and toluene formed a solvent mixture, and the oleylamine also acted as a source of ligands in the resultant nanoparticles. After the reaction mixture had been maintained at 125° C. for 2 minutes the microwave was powered off and the reaction vessel allowed to cool under a flow of nitrogen. The resulting nanocrystal solution was analysed by a Flouromax-4 spectrofluorometer and the photoluminescence maximum wavelength was found to be 650 nm.

<Example 8> Microwave 2-OLA 250 uL

In a 10 mL reaction vessel, diethylzinc (1 mmol), sodium amide (0.77 mmol), oleylamine (250 uL), and toluene (5 mL) were stirred and heated in a 300 W CEM Discover-s microwave to 125° C. The oleylamine and toluene formed a solvent mixture, and the oleylamine also acted as a source of ligands in the resultant nanoparticles. After the reaction mixture had been maintained at 125° C. for 3 minutes the microwave was powered off and the reaction vessel was cooled under a flow of nitrogen. The resulting nanocrystal solution was analysed by a Flouromax-4 spectrofluorometer and the photoluminescence maximum wavelength was measured as 520 nm.

<Example 9> Shelling

In a 50 mL flask, diethylzinc (3 mmole), sodium amide (2 mmole), and toluene (10 mL) as a solvent were stirred and heated at 110° C. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Upon reaching the desired colour (that is, upon reaching the desired wavelength of peak emission) the reaction is quenched by rapidly cooling the solution by adding a quantity of solvent. The solution is then centrifuged to remove insoluble material. The remaining soluble material is used as a nanocrystal solution.

To form the ZnS shell around the nanoparticle core the coloured solution was decanted from the solids and a 4 mL sample was treated with zinc diethyldithiocarbamate (100 mg, 0.27 mmol) for 40 minutes at 175° C.

The resulting shelled nanocrystals showed improved stability to photoxidation compared to the unshelled nanocrystals.

Figure 6:
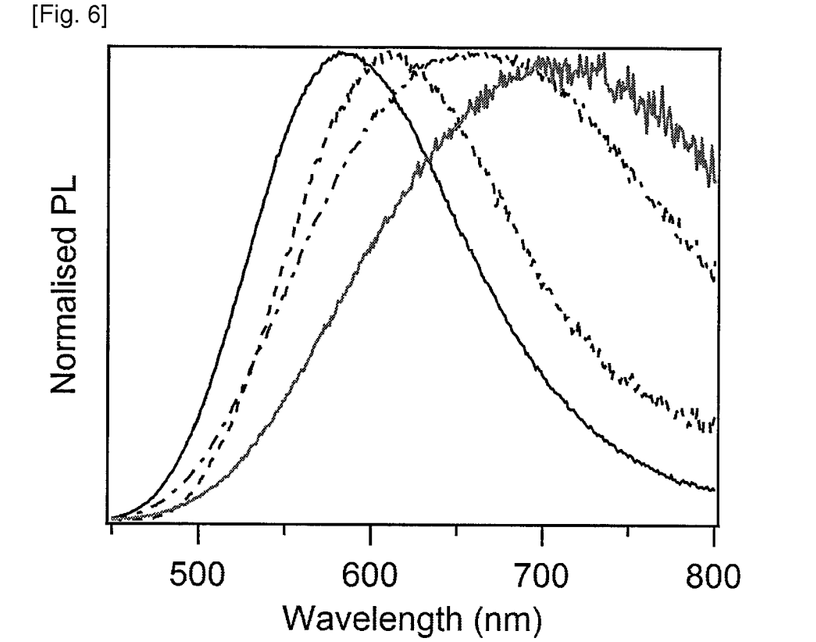
FIG. 6 Emission spectra from aliquots taken from a single reaction of Example 10 at different times.

<Example 10> Trimethylindium and Sodium Amide to Make Indium Nitride Nanocrystals In a 25 mL flask, trimethylindium (1.25 mmole), sodium amide (5.12 mmole), oleylamine (500 uL), and 1-octadecene (5 mL) were stirred and heated at 150° C. The oleylamine and 1-octadecene formed a solvent mixture, and the oleylamine also acted as a source of ligands in the resultant nanoparticles. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction (FIG. 6). Upon reaching the desired colour (that is, upon reaching the desired wavelength of peak emission) the heat source was removed and the reaction stopped. The solution was then centrifuged to remove insoluble material. The remaining soluble material was then used as a nanocrystal solution.

<Example 11> Diethylzinc and Sodium Amide to Make Zinc Nitride Nanocrystals at 40° C.

In a 50 mL flask, diethylzinc (9 mmole), sodium amide (6 mmole), and toluene (30 mL) as a solvent were stirred and heated at 40° C. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Compared to reactions at higher temperatures the rate of reaction is slower—after 18 hours the solution had an emission peak at 624 nm with a full width at half maximum of 160 nm.

<Example 12> Diethylzinc and Ammonia to Make Zinc Nitride Nanocrystals at 300° C.

In a 50 mL flask, 1-octacedence (30 mL) and 1-oleylamine (1 mL) forming a solvent mixture were heated to 300° C. Ammonia gas was bubbled though the solution at a rate of 10 mL/min (the volume of ammonia flowing through the solution per minute is measured at SATP, and may for example be measured using a flow meter placed between the ammonia cylinder and the reaction mixture) for 5 minutes after which time diethyl zinc (1 mmol) was added. The reaction was then allowed to proceed with small aliquots being taken at various times and diluted with toluene. The resulting solutions were analysed by a Flouromax-4 spectrofluorometer; these solutions showed an increase in the peak photoluminescence emission wavelength over the course of the reaction. Compared to reactions at lower temperatures the rate of reaction was faster, after 1 min the solution had an emission peak at 805 nm with a full width at half maximum of >300 nm.

<Example 13> Synthesis of Zinc Nitride Using Sequential Growth

Figure 7:
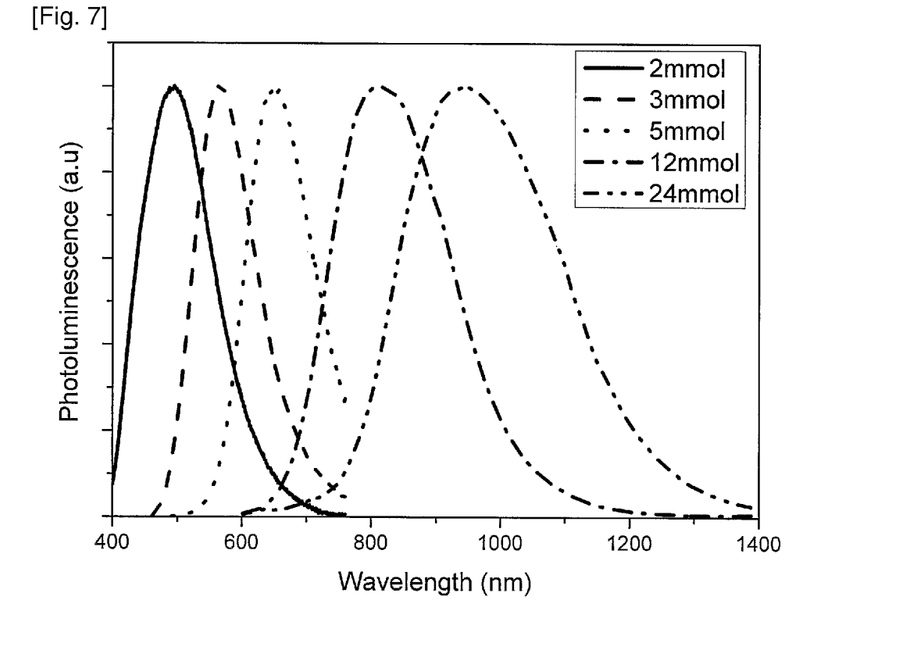
FIG. 7 Emission spectra from various aliquots taken from Example 13 after addition of increasing amounts of diethylzinc.

In a 50 mL flask, 1-octadecene (30 mL) and oleylamine (1 mL) forming a solvent mixture were heated for 20 min at 225° C. Ammonia gas was then bubbled through the solution at a flow rate of (5 mL/min) for 5 min to dissolve some ammonia into the hot solution. Portions of diethylzinc (1 mmol at a time) were then injected into the solution at 5 minute intervals while both the temperature and the ammonia flow rate remained constant. The emission from aliquots taken from this reaction are shown in FIG. 7, for aliquots taken after addition of 2 mmol, 3 mmol, 5 mmol, 12 mmol and 24 mmol as indicated by the legend in the figure. (That is, an aliquot taken after addition of 2 mmol of diethylzinc is taken five minutes after the second of two separate injections, five minutes apart, each of 1 mmol of diethylzinc, and so on.) For the aliquot emitting at 565 nm (3 mmol total of diethylzinc added in 3 lots of 1 mmol each) the photoluminescent quantum yield was measured as 52.5% when excited using 460 nm light.

The mode of the reaction in this example is different to that described in earlier examples. In the previous examples the reaction is allowed to proceed until the desired size of nanoparticle (to give the desired emission wavelength) has been obtained, and the reaction is then stopped by cooling it down. This generally requires that the reaction is monitored, so that it can be stopped when the desired size of nanoparticle has been obtained. In example 13, however, by initially adding a small amount of the diethyl zinc the reaction is allowed to reach completion which, for the specific quantities mentioned, occurs after about 5 minutes. At this time the reaction can be terminated if the desired size has been obtained. Alternatively, if larger nanocrystals are required, a second addition of diethylzinc can be made as described in the example—this will restart the reaction, leading to a further increase in the nanocrystal size. The reaction will again reach completion, when the diethylzinc added in the second addition has reacted. The nanoparticle size (or the emission wavelength can again be measured), and if desired a third addition of diethylzinc can be made—and this process of making a further addition of diethylzinc to restart the reaction, waiting for the reaction to reach completion, and determining the nanoparticle size (or the emission wavelength) can be repeated as many times as required.

A further advantage of the sequential addition of diethylzince is that, when the reaction reaches completion all the diethyl zinc has been consumed, whereas in earlier examples the reaction is halted before it has reached completion and hence the reaction solution is likely to contain some unreacted diethyl zinc. The excess diethyl zinc will both lower the yield of the reaction and also act as a impurity in the isolated nanocrystal solution.

<Example 14> Isolation of Zinc Nitride Nanocrystals of Different Sizes

Figure 8:
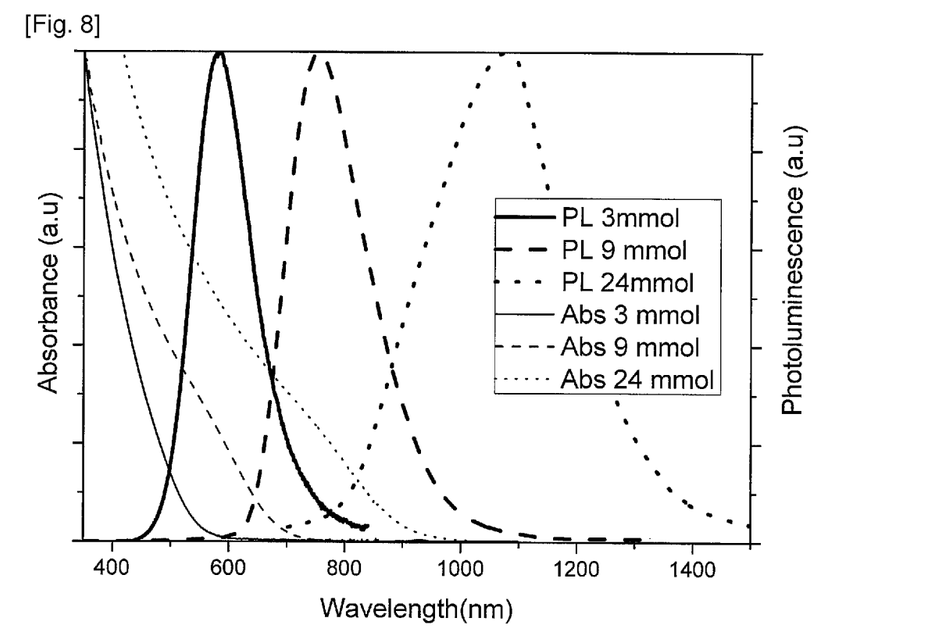
FIG. 8 Absorption (thin lines) and emission (thick lines) spectra of solutions of zinc nitride nanocrystals containing different sized nanocrystals obtained from Example 14. The emission maximum are at 585 nm, 752 nm and 1073 nm for samples obtained after the addition of 3 mmol (solid lines), 9 mmol (dashed lines) and 24 mmol (dotted lines) of diethyl zinc respectively.

In a 50 mL flask, 1-octadecene (30 mL) and oleylamine (1 mL) forming a solvent mixture were heated for 20 min at 225° C. Ammonia gas was then bubbled through the solution at the chosen flow rate (5 mL/min) for 5 min to dissolve some ammonia into the hot solution. Portions of diethylzinc (1 mmol) were then injected into the solution at 5 minute intervals while both the temperature and the ammonia flow rate remained constant. After 3 mmol of diethyl zinc had been added a sample 1 was removed, after the addition of 9 mmol of diethyl zinc sample 2 was removed and finally after the addition of 24 mmol of diethyl zinc sample 3 was removed. The samples were purified by the addition of acetonitrile, isobutyronitrile and toluene to cause precipitation of the nanocrystals. The solid was then solvated in toluene, before being precipitated again with acetonitrile and isobutyronitrile (this step was repeated 3 times in total). FIG. 8 shows the absorption and emission spectra obtained for the purified samples obtained after the addition of 3, 9 and 24 mmols of diethyl zinc. The emission maximum are at 585 nm, 752 nm and 1073 nm for samples obtained after the addition of 3 mmol (solid lines), 9 mmol (dashed lines) and 24 mmol (dotted lines) of diethyl zinc respectively.

Figure 9:
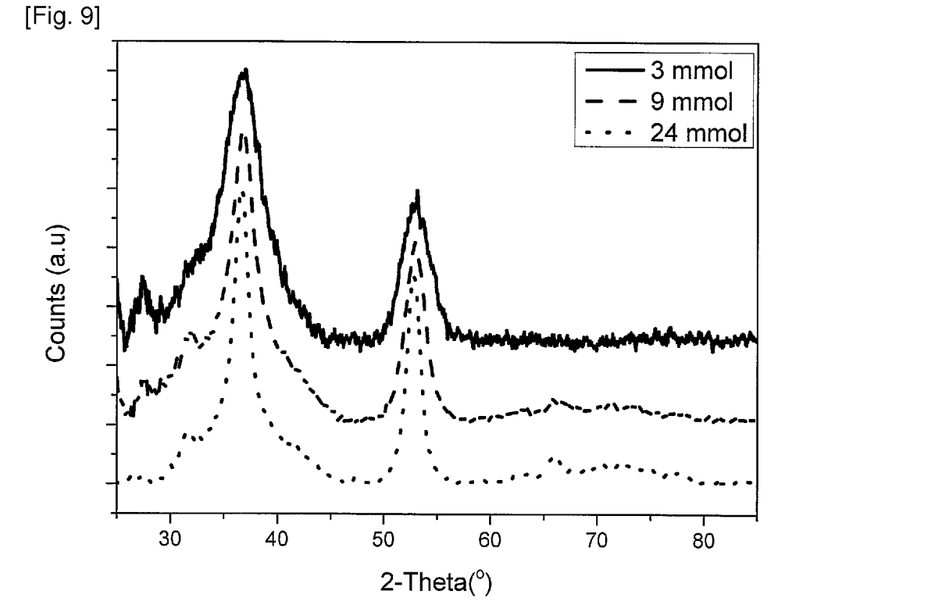
FIG. 9 X-ray diffraction patterns obtained from samples of zinc nitride nanocrystals containing different sized nanocrystals from Example 14. Scherrer broadening is apparent in these traces suggesting that an increase in size is occurring as the quantity of diethyl zinc added to the mixture in increased from 3 mmol (solid line) though 9 mmol (dashed line) to 24 mmol (dotted line).
Figure 11:
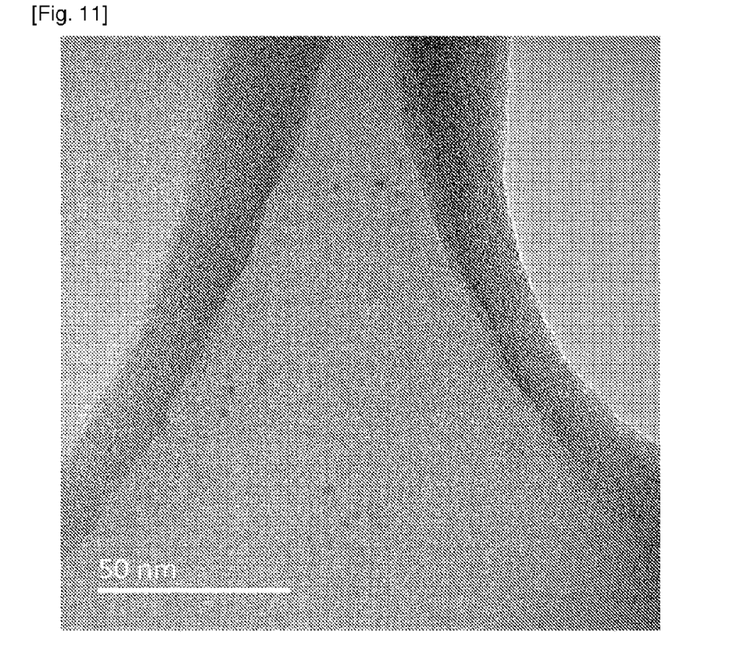
FIG. 11 TEM of zinc nitride nanocrystals obtained from Example 14 after addition of 3 mmol of diethylzinc.
Figure 12:
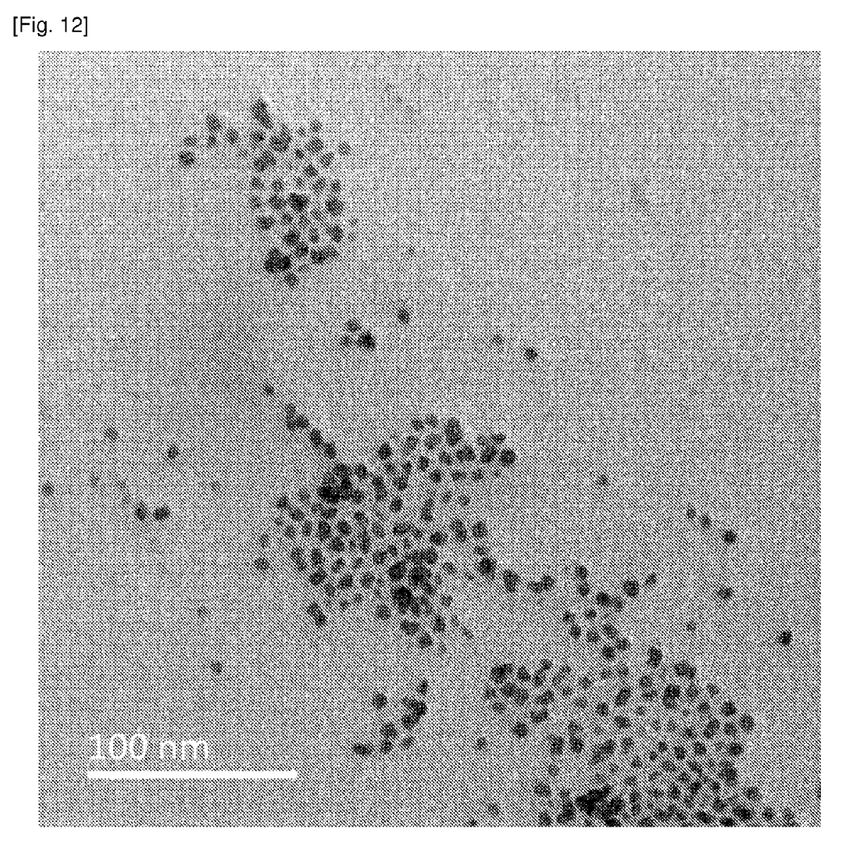
FIG. 12 TEM of zinc nitride nanocrystals obtained from Example 14 after addition of 9 mmol of diethylzinc.
Figure 13:
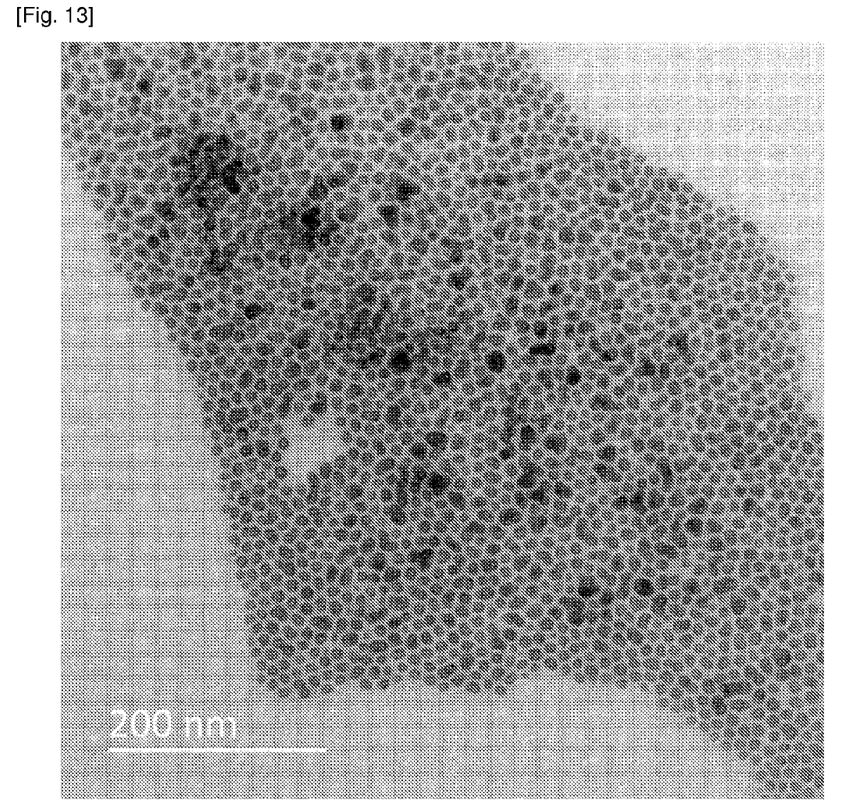
FIG. 13 TEM of zinc nitride nanocrystals obtained from Example 14 after addition of 24 mmol of diethylzinc.

FIG. 9 shows XRD patterns obtained from the three samples. Scherrer broadening is apparent in these traces suggesting that an increase in size is occurring as the quantity of diethyl zinc added to the mixture in increased from 3 mmol (solid line) though 9 mmol (dashed line) to 24 mmol (dotted line). It is clear that during the synthesis that the size of the nanocrystals increases since the XRD peaks become narrower due to reduced Scherrer broadening. The transmission electron micrographs of FIGS. 11, 12 and 13, which were taken after addition of 3, 9 and 24 mmol of diethylzinc respectively, also support an increase in the size of the nanocrystals over the course of the reaction. The average diameter of the nanocrystals in FIG. 11 is 2 nm, the average diameter of the nanocrystals in FIG. 12 is 3.9 nm, and the average diameter of the nanocrystals in FIG. 13 is 6.8 nm.

<Example 15> Synthesis of Cu3N from Mesitylcopper and Ammonia

Figure 10:
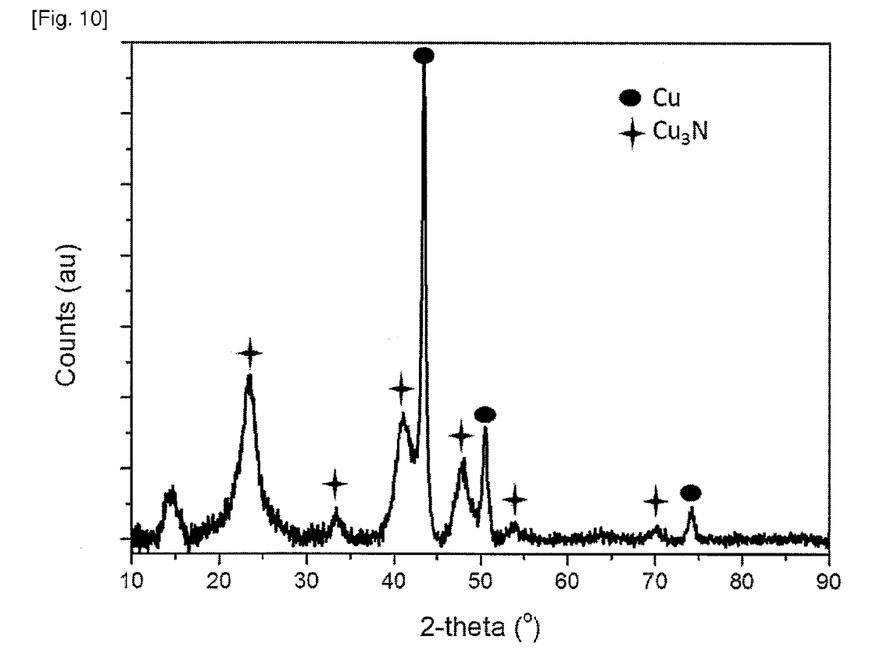
FIG. 10 X-ray diffraction patterns obtained from a sample of copper nitride ($Cu_3N$) nanocrystals prepared according to the method described in Example 15. Peaks corresponding to $Cu_3N$ are identified with a four pointed star whereas those originating from a copper impurity are identified with a solid circle.

In a 50 mL flask a mixture of mesitylcopper (1 mmole) and 1-Octadecene (20 mL) was heated at 275° C. for 15 min. Ammonia was then bubbled through the solution for 10 min at a rate of 5 mL/min (measured at SATP), while maintaining the temperature at 275° C. The ammonia flow was stopped and the solution cooled to give a solid. This solid was then washed with hexanes to remove excess octadecene, and analysed via XRD. The product clearly matched to copper nitride nanocrystals, with some metallic copper also present. FIG. 10 shows X-ray diffraction patterns obtained from a sample of copper nitride ($Cu_3N$) nanocrystals prepared according to the method of this example. Peaks corresponding to Cu3N are identified with a four pointed star whereas those originating from a copper impurity are identified with a solid circle.

<Example 16> Varying the Ammonia Flow Rate

Figure 14:
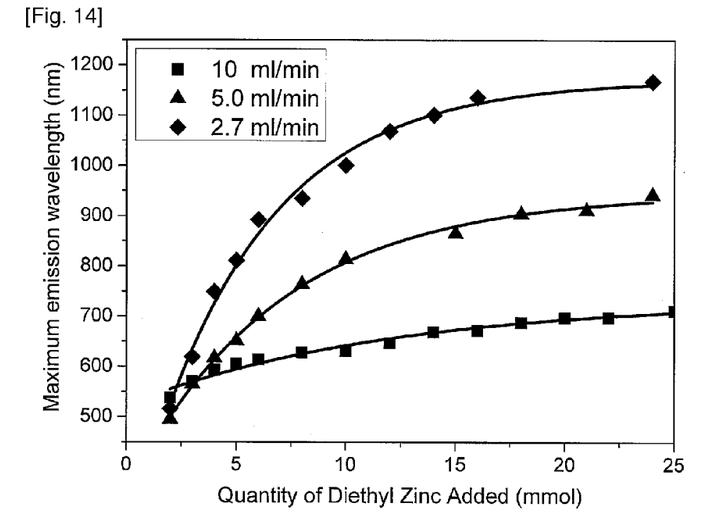
FIG. 14 Graph showing the effect of the flow rate of ammonia gas on the emission wavelength from example 16.

In a 50 mL flask, 1-octadecene (30 mL) and of oleylamine (1 mL) were heated for 20 min at 225° C. Ammonia gas was then bubbled through the solution at the chosen flow rate (2.7, 5 or 10 mL/min) for 5 min to dissolve some ammonia into the hot solution. Portions of diethylzinc (1 mmol) were then injected in the solution at 5 minute intervals while both the temperature and the ammonia flow rate remained constant. Samples were removed after each addition and their emission spectra were measured. The data is presented in FIG. 14, which shows the wavelength of peak emission plotted against the quantity of diethylzinc added—the three curves correspond to the three ammonia flow rates mentioned above. Quantum yields measured on samples with a peak emission wavelength close to 600 nm showed that the PLQY increased from 15% to 45% when the flow was reduced from 10 mL/min to 5 mL/min.

That is, in addition to affecting the rate of the reaction, the ammonia flow rate also affects the PLQY of the resulting nanocrystals. For a specific example we found that for a 30 mL reaction mixture an ammonia flow rate of 5 mL/min was optimum giving higher quantum yields. In general, for a 30 mL reaction mixture, it is expected that an ammonia flow rate in excess of 30 mL/min would be excessive and cause a very slow reaction, whereas flow rates below 1 mL/min will probably not provide sufficient ammonia to obtain high PLQYs.

<Example 17> Varying the Quantity of Diethyl Zinc Used in Sequential Addition

Figure 15:
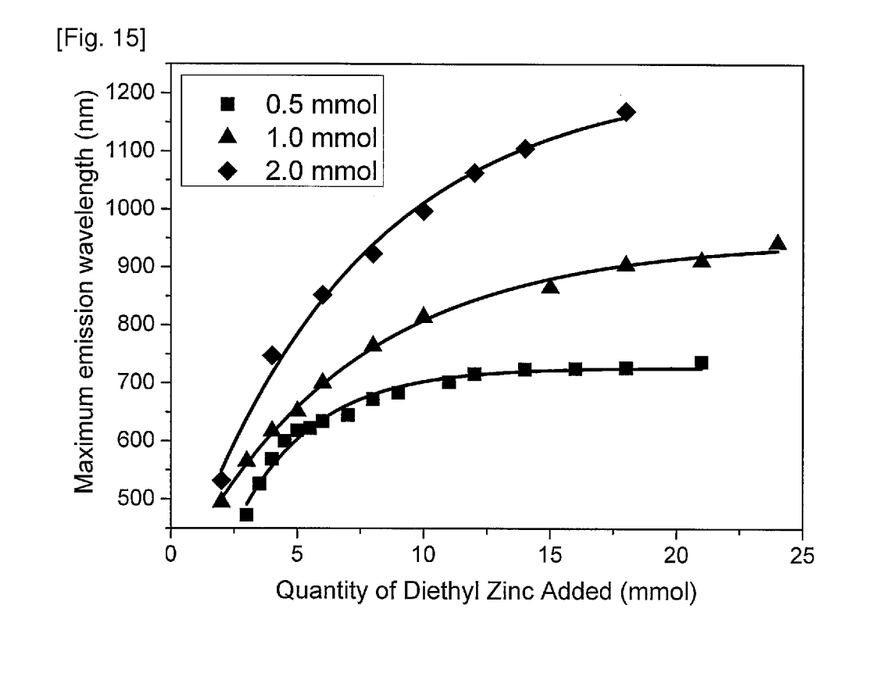
FIG. 15 Graph showing the effect of quantity of diethyl zinc used in each sequential addition on the emission wavelength from example 17.

In a 50 mL flask, 1-octadecene (30 mL) and of oleylamine (1 mL) were heated for 20 min at 225° C. Ammonia gas was then bubbled through the solution at a flow rate of 5 mL/min for 5 min to dissolve some ammonia in the hot solution. Portions of diethylzinc (0.5, 1 or 2 mmol) were then injected into the solution at 5 minute intervals as described for example 13 above, while both the temperature and the ammonia flow rate remained constant. Samples were removed after each addition and their emission spectra were measured. FIG. 15 shows the wavelength of maximum emission plotted against the quantity of diethylzinc added—the three curves correspond to addition of 0.5 mmol of diethylzinc every 5 minutes, to addition of 1.0 mmol of diethylzinc every 5 minutes, and to addition of 2.0 mmol of diethylzinc every 5 minutes.

Comparison of FIGS. 16 and 17 shows that increasing the amount of diethyl zinc introduced at each sequential addition has a similar effect to lowering the flow rate of ammonia. This suggests it may be that, in a method where diethyl zinc (or another metal precursor) is introduced into the reaction mixture by sequential additions, the ratio of the amount of diethyl zinc introduced at each addition to the flow rate of ammonia may be a parameter that can be controlled in order to obtain a good reaction rate and a high PLQY in the obtained nanoparticles. For an ammonia flow rate of 5 mL/min we found it optimum to introduce 1 mmol of diethyl zinc at each addition to obtain good control over the emission wavelength of the resultant nanoparticles.

Although the flask size, temperature, time of reaction, form of nitrogen precursor, alkyl-metal, and solvent for pulls are described in the examples specifically, they are meant as guides, not as the only possible parameters covered by this patent application.

In the examples above in which the reaction constituents are heated by microwaves (examples 7 and 8) the reactions may be carried out in sealed reaction vessels, e.g. in sealed tubes, and as a result the reaction can occur at a temperature higher than the boiling point of the reactants. In the other examples the reactions may be carried out in open flasks and it is believed that the reaction occurs rapidly such that the alkyl metal (or other organometallic compound) does not have time to evaporate significantly from the reaction mixture.

Many of the materials used in the invention are sensitive to oxygen and water, and some are pyrophoric (i.e., ignite spontaneously in air). All reactions involving air sensitive or pyrophoric materials should be performed in an inert atmosphere such as nitrogen filled glove box or using standard procedures for the safe handling of such compounds.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

The invention claimed is:

1. A method of producing nitride nanoparticles, the method comprising: reacting at least one source of nitrogen with at least one organometallic compound at a reaction temperature less than 300° C., the reaction producing the nitride nanoparticles, the at least one source of nitrogen comprising ammonia or a metal amide, and the organometallic compound(s) being either in a liquid phase or in liquid solution.

2. A method as claimed in claim 1 and comprising reacting the at least one organometallic compound and the at least one source of nitrogen in at least one solvent.

3. A method as claimed in claim 2 and comprising reacting the at least one organometallic compound and the at least one source of nitrogen in a solvent mixture comprising at least two solvents.

4. A method as claimed in claim 3 wherein at least one of the solvents in the solvent mixture provides a ligand for the nitride nanoparticles.

5. A method as claimed in claim 2, wherein the at least one solvent comprises an aprotic solvent.

6. A method as claimed in claim 2 and comprising disposing the at least organometallic compound and the at least one source of nitrogen in the at least one solvent to form a reaction mixture.

7. A method as claimed in claim 6, and comprising, at a first time, disposing a first quantity of the or each organometallic compound in the at least one solvent and, at a second time later than the first time, disposing a second quantity of the or each organometallic compound in the at least one solvent.

8. A method as claimed in claim 6, wherein the reaction temperature is greater than 200° C., and wherein the at least one source of nitrogen comprises the ammonia.

9. A method as claimed in claim 6, wherein the reaction temperature is less than 200° C., and wherein the at least one source of nitrogen comprises the metal amide.

10. A method as claimed in claim 2 and comprising disposing the at least one organometallic compound in the at least one solvent to form a reaction mixture, and passing the at least one source of nitrogen through the reaction mixture.

11. A method as claimed in claim 10, and comprising, at a first time, disposing a first quantity of the or each organometallic compound in the at least one solvent and, at a second time later than the first time, disposing a second quantity of the or each organometallic compound in the at least one solvent.

12. A method as claimed in claim 11, wherein the at least one source of nitrogen consists solely of ammonia gas, and wherein the molar quantity of the first and any subsequent addition of the or each organometallic compound is at least 2% of the molar quantity of ammonia passing through the reaction mixture per minute.

13. A method as claimed in claim 11, wherein the at least one source of nitrogen consists solely of ammonia gas, and wherein the molar quantity of the first and any subsequent addition of the or each organometallic compound is no more than twice of the molar quantity of ammonia passing through the reaction mixture per minute.

14. A method as claimed in claim 10, wherein the reaction temperature is less than 200° C., and wherein the at least one source of nitrogen comprises the metal amide.

15. A method as claimed in claim 10, wherein the reaction temperature is greater than 200° C., and wherein the at least one source of nitrogen comprises the ammonia.

16. A method as claimed in claim 2, wherein the at least one source of nitrogen consists solely of ammonia gas, and wherein the volume of ammonia per minute passed through the reaction mixture is greater than 1% of the volume of the reaction mixture.

17. A method as claimed in claim 2, wherein the at least one source of nitrogen consists solely of ammonia gas, and wherein the volume of ammonia per minute passed through the reaction mixture is less than the volume of the reaction mixture.

18. A method as claimed in claim 1, wherein the reaction directly produces the nitride nanoparticles without an intermediate calcination step.

19. A method of producing nitride nanoparticles, the method comprising: reacting at least one source of nitrogen with at least one organometallic compound at a reaction temperature less than 300° C., the reaction producing the nitride nanoparticles, the organometallic compound(s) being either in a liquid phase or in liquid solution, wherein the at least one organometallic compound comprises at least one alkyl metal compound, and wherein the at least one alkyl metal compound comprises one or more of: diethylzinc, triethylaluminium and trimethylindium.

20. A method as claimed in claim 19, wherein the at least one source of nitrogen comprising ammonia or a metal amide.

* * * * *